US012609682B2

(12) United States Patent　(10) Patent No.:　US 12,609,682 B2
Chono et al.　(45) Date of Patent:　Apr. 21, 2026

(54) COMPUTING DEVICE

(71) Applicant: KABUSHIKI KAISHA TOSHIBA,
Tokyo (JP)

(72) Inventors: Hiroomi Chono, Kawasaki Kanagawa
(JP); Hayato Goto, Kawasaki
Kanagawa (JP); Taro Kanao,
Kumagaya Saitama (JP)

(73) Assignee: Kabushiki Kaisha Toshiba, Kawasaki
(JP)

( * ) Notice: Subject to any disclaimer, the term of this
patent is extended or adjusted under 35
U.S.C. 154(b) by 0 days.

(21) Appl. No.: 18/760,388

(22) Filed: Jul. 1, 2024

(65) Prior Publication Data

US 2025/0080094 A1　Mar. 6, 2025

(30) Foreign Application Priority Data

Aug. 28, 2023　(JP) ................................. 2023-138071

(51) Int. Cl.
　*H03K 3/38*　(2006.01)
　*G06N 10/40*　(2022.01)
　*H10N 60/12*　(2023.01)
(52) U.S. Cl.
　CPC ............... *H03K 3/38* (2013.01); *G06N 10/40*
　(2022.01); *H10N 60/12* (2023.02)
(58) Field of Classification Search
　CPC ........... H03K 3/38; G06N 10/40; H10N 60/12
　See application file for complete search history.

(56) References Cited

U.S. PATENT DOCUMENTS

2020/0083423 A1　3/2020　Goto
2023/0127101 A1*　4/2023　Yamaguchi ............ H03K 17/92
　　　　　　　327/527
2024/0070502 A1*　2/2024　Ethier-Majcher ...... G06N 10/20

FOREIGN PATENT DOCUMENTS

JP　2020-43259 A　3/2020

OTHER PUBLICATIONS

Hiroomi Chono et al., "Two-qubit gate using conditional driving for
highly detuned Kerr nonlinear parametric oscillators" Phys. Rev.
Res., vol. 4, No. 043054, DOI: 10.1103/PhysRevResearch.4.
043054, 8 pages (2022).
S. Masuda et al., "Fast Tunable Coupling Scheme of Kerr Para-
metric Oscillators Based on Shortcuts to Adiabaticity," Phys. Rev.,
vol. 18, No. 034076, DOI: 10.1103/PhysRevApplied.18.034076, 12
pages (2022).

(Continued)

*Primary Examiner* — Sibin Chen
(74) *Attorney, Agent, or Firm* — Finnegan, Henderson,
Farabow, Garrett & Dunner, LLP

(57)　ABSTRACT
According to one embodiment, a computing device includes
an element section, a first control member, and a controller.
The element section includes a first qubit including a first
loop including a plurality of first Josephson junctions, and a
second qubit including a second loop including a plurality of
second Josephson junctions. The second qubit is configured
to be connected with the first qubit. The controller is
configured to cause the first control member to execute a first
operation. In the first operation, the controller is configured
to cause the first control member to apply a pulse wave
including a DC component to the first loop while applying
a first signal wave including a first AC component to the first
loop.

18 Claims, 3 Drawing Sheets

(56)             References Cited

OTHER PUBLICATIONS

Andrew S. Darmawan et al., "Practical Quantum Error Correction with the XZZX Code and Kerr-Cat Qubits," PRX Quantum, vol. 2, No. 030345, DOI: 10.1103/PRXQuantum.2.030345, 21 pages (2021).

Hayato Goto, "Universal quantum computation with a nonlinear oscillator network," Phys. Rev. A vol. 93, No. 050301(R), DOI: 10.1103/PhysRevA.93.050301, 4 pages (2016).

Shruti Puri et al., "Engineering the quantum states of light in a Kerr-nonlinear resonator by two-photon driving," NPJ Quant. Inf., vol. 3, No. 18, doi: 10.1038/s41534-017-0019-1, 7 pages (2017).

Shruti Puri et al., "Bias-preserving gates with stabilized cat qubits," Sci. Adv., vol. 6, No. eaay5901, 15 pages (2020).

Qian Xu et al., "Engineering fast bias-preserving gates on stabilized cat qubits," Phys. Rev. Res., vol. 4, No. 013082, DOI: 10.1103/PhysRevResearch.4.013082, 16 pages (2022).

* cited by examiner

COMPUTING DEVICE

CROSS-REFERENCE TO RELATED APPLICATIONS

This application is based upon and claims the benefit of priority from Japanese Patent Application No. 2023-138071, filed on Aug. 28, 2023; the entire contents of which are incorporated herein by reference.

FIELD

Embodiments described herein relate generally to a computing device.

BACKGROUND

For example, electronic circuits including multiple non-linear elements are used in computing devices. Improvements in characteristics are desired in electronic circuits and computing devices.

DETAILED DESCRIPTION

Figure 1:
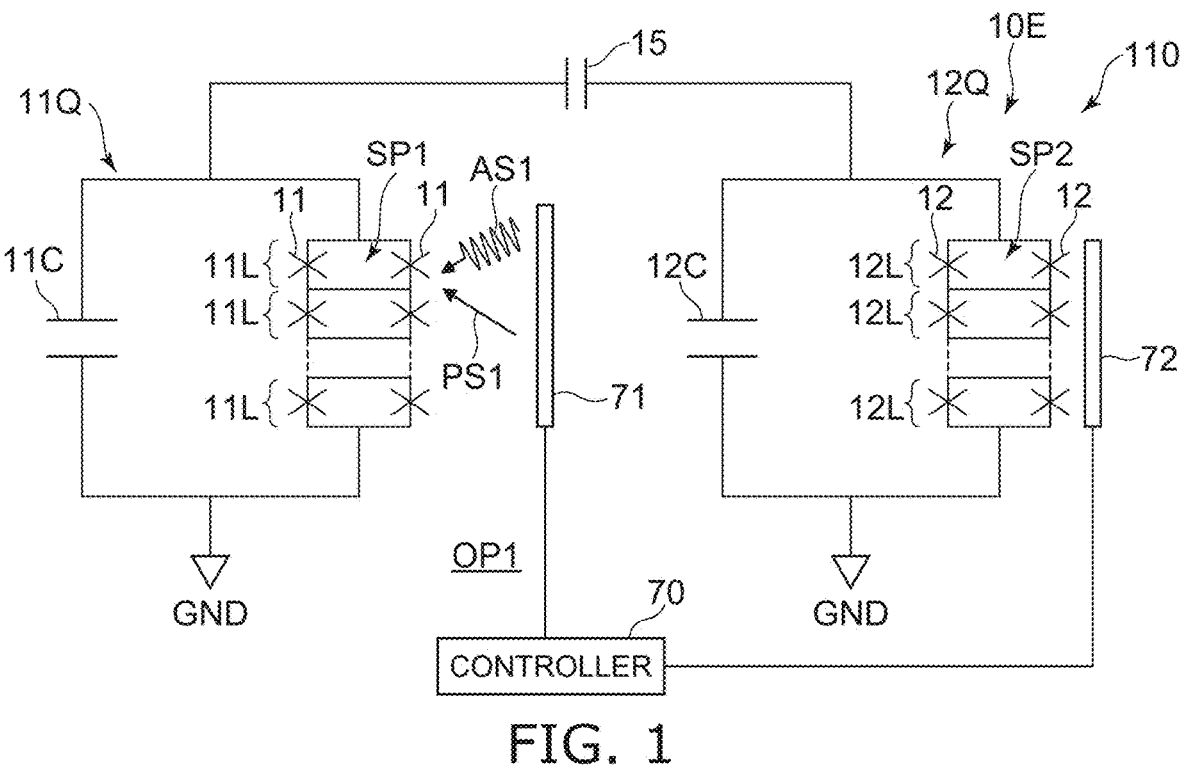
FIG. 1 is a schematic diagram illustrating a computing device according to a first embodiment.

According to one embodiment, a computing device includes an element section, a first control member, and a controller. The element section includes a first qubit including a first loop including a plurality of first Josephson junctions, and a second qubit including a second loop including a plurality of second Josephson junctions. The second qubit is configured to be connected with the first qubit. The controller is configured to cause the first control member to execute a first operation. In the first operation, the controller is configured to cause the first control member to apply a pulse wave including a DC component to the first loop while applying a first signal wave including a first AC component to the first loop.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic diagram illustrating a computing device according to a first embodiment.

As shown in FIG. 1, a computing device 110 according to the embodiment includes an element section 10E, a first control member 71, and a controller 70.

The element section 10E includes a first qubit 11Q and a second qubit 12Q. The first qubit 11Q includes a first loop 11L. The first loop 11L includes a plurality of first Josephson junctions 11. For example, the first loop 11L includes two first Josephson junctions 11. In this example, the first qubit 11Q includes a plurality of first loops 11L. Two of the plurality of first loops 11L are connected to each other.

In this example, the first qubit 11Q further includes a first capacitor 11C. The first capacitor 11C is connected in parallel with the first loop 11L.

The second qubit 12Q includes a second loop 12L. The second loop 12L includes a plurality of second Josephson junctions 12. For example, the second loop 12L includes two second Josephson junctions 12. In this example, the second qubit 12Q includes a plurality of second loops 12L. Two of the plurality of second loops 12L are connected to each other.

In this example, the second qubit 12Q further includes a second capacitor 12C. The second capacitor 12C is connected in parallel with the second loop 12L.

The second qubit 12Q is configured to be coupled with the first qubit 11Q. For example, the second qubit 12Q is coupled with the first qubit 11Q via a capacitor 15. The coupling includes, for example, a capacitive coupling. The coupling may include, for example, any electromagnetic coupling.

The first control member 71 may be provided, for example, near the first loop 11L. The computing device 110 may include a second control member 72. The second control member 72 may be provided near the second loop 12L. These control members are, for example, conductive members. Electrical signals are supplied to these conductive members from the controller 70. As a result, a magnetic field is generated from the conductive member. This magnetic field controls the magnetic flux in the loop.

The controller 70 is configured to cause the first control member 71 to execute a first operation OP1. In the first operation OP1, the controller 70 causes the first control member 71 to apply a pulse wave PS1 to the first loop 11L while applying a first signal wave AS1 to the first loop 11L. The first signal wave AS1 includes a first AC component. The pulse wave PS1 is a pulse wave including a DC component.

For example, the magnetic flux in the first loop 11L is modulated at a frequency of the first AC component by the first signal wave AS1 including the first AC component. The magnetic flux in the first loop 11L is controlled according to the DC component of the pulse wave PS1 by the pulse wave PS1. By the first operation OP1, for example, a two-qubit gate operation can be executed at a high speed.

For example, an AC Stark shift may occur when a two-qubit gate operation is executed by microwave. The AC Stark shift shifts the resonance frequency of the qubit from its initial value. Thereby, when a two-qubit gate operation with a high gate fidelity is executed, the time of the two-qubit gate operation may become longer.

In the embodiment, while the first signal wave AS1 including an AC component is applied to the first loop 11L, the pulse wave PS1 including a DC component is applied to the first loop 11L. The shift of the resonance frequency of the first qubit 11Q is compensated by the pulse wave PS1. The pulse wave PS1 is set, for example, to correspond to the shift of the resonance frequency of the first qubit 11Q caused by the AC stalk shift caused by the first signal wave AS1.

Thereby, a high-speed two-qubit gate operation can be executed. A two-qubit gate operation with high gate fidelity can be executed. According to the embodiment, a computing device capable of improving characteristics can be provided.

For example, the first qubit 11Q is a parametric oscillator (Kerr parametric oscillator, KPO). The first qubit 11Q oscillates by modulating the magnetic flux in the first loop 11L with a first parametric excitation frequency fp1. The first parametric excitation frequency fp1 is substantially twice a first characteristic frequency $\omega 1$ of the first qubit 11Q. The first characteristic frequency $\omega 1$ corresponds to the first resonance frequency of the first qubit 11Q when no external signal is applied to the first qubit 11Q. The magnetic flux in the first loop 11L is controlled by the first control member 71.

For example, the second qubit 12Q is a parametric oscillator (Kerr parametric oscillator, KPO). The second qubit 12Q oscillates by modulating the magnetic flux in the second loop 12L with a second parametric excitation frequency fp2. The second parametric excitation frequency fp2 is substantially twice a second characteristic frequency $\omega 2$ of the second qubit 12Q. The second characteristic frequency $\omega 2$ corresponds to the second resonance frequency of the second qubit 12Q when no external signal is applied to the second qubit 12Q. The magnetic flux in the second loop 12L is controlled by the second control member 72.

For example, detuning is controlled by the pulse wave PS1. In the embodiment, the detuning of the first qubit 11Q corresponds to a difference between a resonance frequency shifted by the AC stark shift in the first qubit 11Q and ½ of the first parametric excitation frequency fp1, for example.

For example, the frequency of the first AC component of the first signal wave AS1 may be a sum of the first characteristic frequency $\omega 1$ of the first qubit 11Q and the second characteristic frequency $\omega 2$ of the second qubit 12Q (that is, $\omega 1 + \omega 2$).

For example, when the first characteristic frequency $\omega 1$ is lower than the second characteristic frequency $\omega 2$, the resonance frequency of the first qubit 11Q shifts from the initial value to a high frequency side due to the AC stalk shift caused by the first signal wave AS1. For example, the resonance frequency of the qubit shifts to the low frequency side due to the pulse wave PS1. Thereby, the AC stalk shift is compensated.

For example, when the first characteristic frequency $\omega 1$ is higher than the second characteristic frequency $\omega 2$, the AC stalk shift caused by the first signal wave AS1 shifts the resonance frequency of the first qubit 11Q from the initial value to a low frequency side. For example, the resonance frequency of the first qubit 11Q is shifted to the high frequency side by the pulse wave PS1. Thereby, the AC stalk shift is compensated.

According to the embodiment, a high-speed two-qubit gate operation can be executed. A two-qubit gate operation with high-gate fidelity can be executed.

In embodiments, for example, the second characteristic frequency $\omega 2$ may be higher than the first characteristic frequency $\omega 1$. It is easy to obtain high fidelity. In one example, the first characteristic frequency $\omega 1$ may be not less than 9 GHZ and not more than 9.5 GHZ. In one example, the second characteristic frequency $\omega 2$ may be not less than 10 GHz and not more than 10.5 GHZ.

The controller 70 executes the two qubit gate on the first qubit 11Q and the second qubit 12Q by the first operation OP1.

For example, there is a first reference example in which the pulse wave PS1 is not applied and only the first signal wave AS1 is applied. In the two-qubit gate operation in the first reference example, the gate fidelity is 0.9871 when the gate time is 15 ns.

On the other hand, in the embodiment, the pulse wave PS1 is applied together with the first signal wave AS1. In the two-qubit gate operation in such an embodiment, the gate fidelity is 0.9964 when the gate time is 15 ns. Thus, in the embodiment, a higher gate fidelity is obtained than in the first reference example. This corresponds to a shorter time for obtaining the same gate fidelity. According to the embodiment, high-speed two-qubit gate operation is possible.

Figure 2:
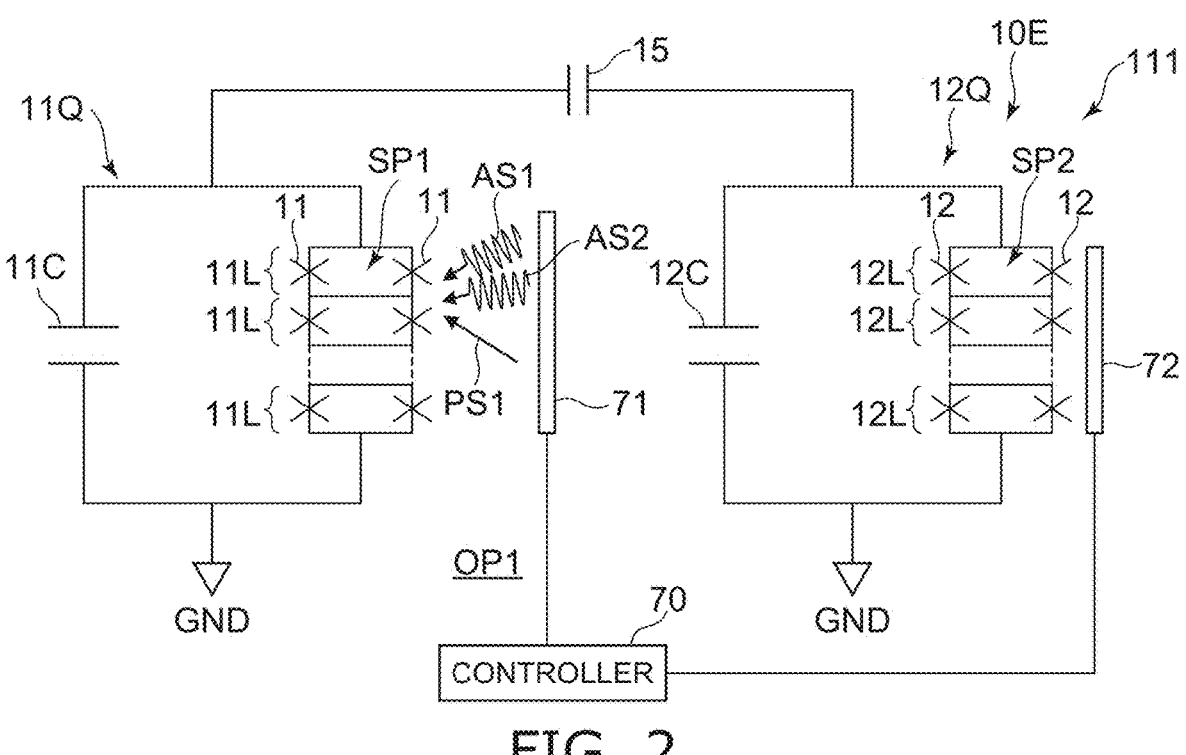
FIG. 2 is a schematic diagram illustrating a computing device according to the first embodiment.

FIG. 2 is a schematic diagram illustrating a computing device according to the first embodiment.

FIG. 2 illustrates another first operation OP1 in a computing device 111 according to the embodiment. The configuration of the element section 10E and the first control member 71 in the computing device 111 may be the same as that of the computing device 110. In the other first operation OP1 in the computing device 111, the controller 70 causes the first control member 71 to apply the pulse wave PS1 including the DC component to the first loop 11L while applying a first signal wave AS1 including a first AC component to the first loop 11L and a second signal wave AS2 including a second AC component to the first loop 11L.

For example, the phase (second phase) of the second AC component is shifted from the phase (first phase) of the first AC component. The difference between the second phase and the first phase may be, for example, not less than 80 degrees and not more than 110 degrees. For example, the difference between the second phase and the first phase may be, for example, 90 degrees. For example, the frequency of the second AC component may be substantially the same as the frequency of the first AC component.

When such a second signal wave AS2 with shifted phase is applied, a faster two-qubit gate operation can be obtained. For example, when the second signal wave AS2 is further used, the gate fidelity of the two-qubit gate operation is 0.9984 when the gate time is 15 ns. A higher gate fidelity is obtained. The characteristics can be improved.

The application of the second signal wave AS2 with shifted phase corresponds, for example, to a differential signal of the first signal wave AS1 for gate operation.

An operation similar to the first operation OP1 described with respect to FIGS. 1 and 2 may be applied to the second qubit 12Q. For example, as shown in FIGS. 1 and 2, the second control member 72 may be further provided. The controller 70 may cause the second control member 72 to execute a second operation. In the second operation, the controller causes the second control member 72 to apply a second qubit pulse wave including a second qubit DC component to the second loop 12L while applying a second qubit signal wave including a second qubit AC component to the second loop 12L. A high-speed two-qubit gate operation can be executed in the first qubit 11Q and the second qubit 12Q. A two-qubit gate operation with high gate fidelity can be executed.

Second Embodiment

Figure 3:
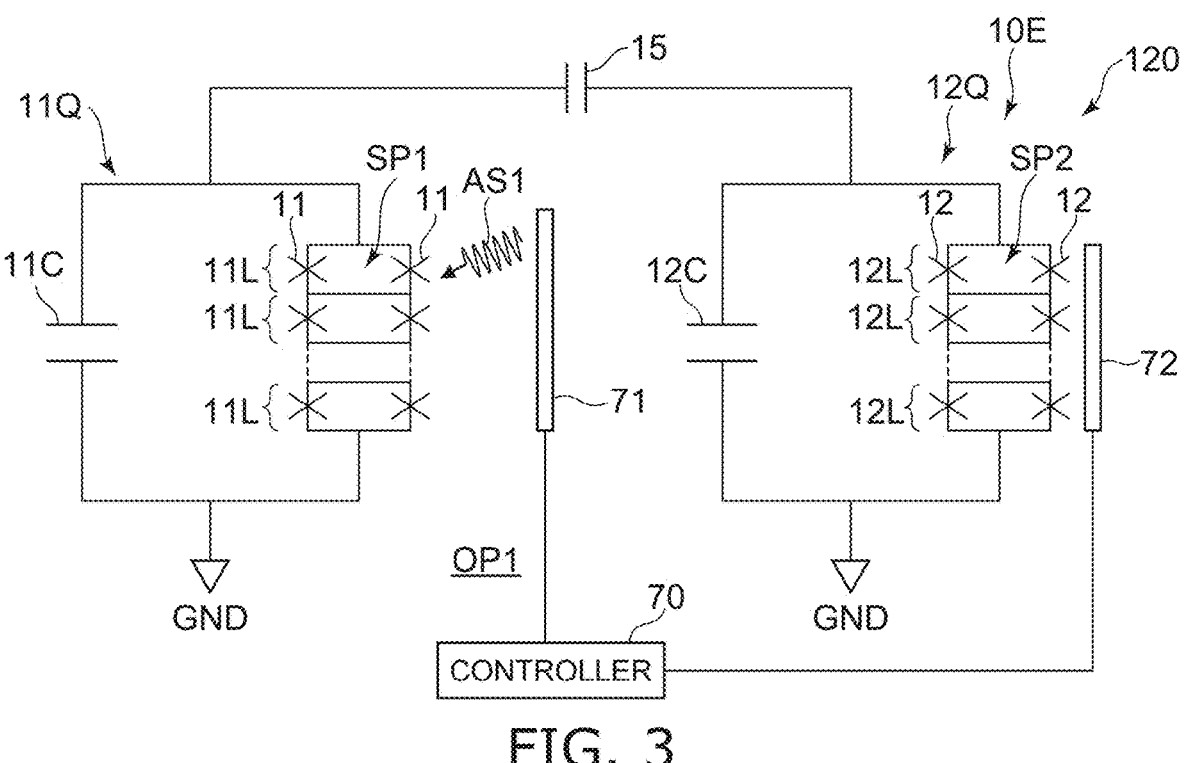
FIG. 3 is a schematic diagram illustrating a computing device according to a second embodiment.

FIG. 3 is a schematic diagram illustrating a computing device according to the second embodiment.

As shown in FIG. 3, a computing device 120 according to the embodiment also includes the element section 10E, the first control member 71, and the controller 70. The configuration of the element section 10E and the first control member 71 in the computing device 120 may be the same as those of the computing device 110 or the computing device 111.

In the computing device 120, in the first operation OP1, the controller 70 causes the first control member 71 to apply the first signal wave AS1 including the first AC component to the first loop 11L. The frequency of the first AC component changes with time. Thereby, for example, the shift of the resonance frequency of the first qubit 11Q due to the AC stalk shift caused by the first signal wave AS1 is compensated. Thereby, a high-speed two-qubit gate operation can be executed. According to the embodiment, a computing device capable of improving characteristics can be provided.

Figure 4:
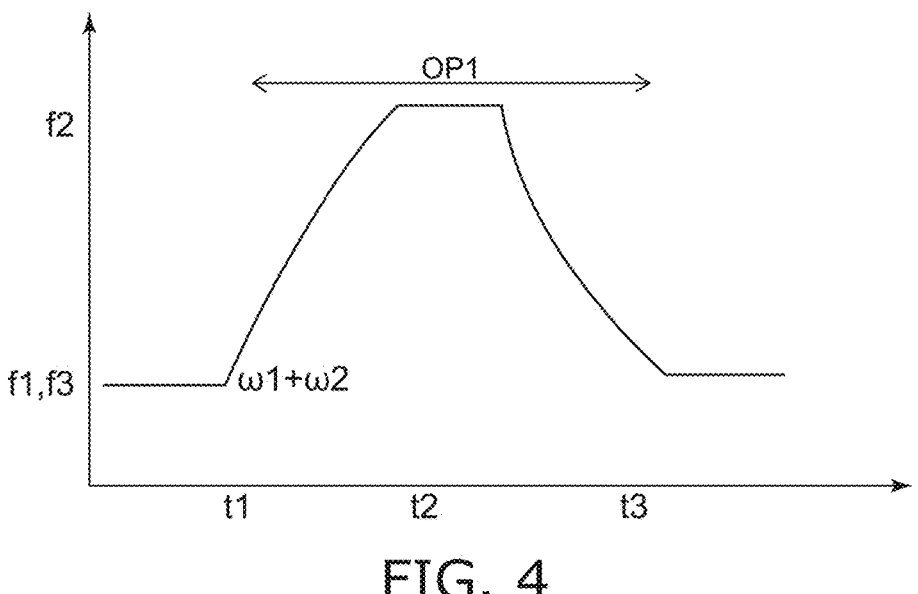
FIG. 4 is a schematic diagram illustrating the operation of the computing device according to the second embodiment.

FIG. 4 is a schematic diagram illustrating the operation of the computing device according to the second embodiment.

FIG. 4 illustrates a change in the frequency of the first AC component. The horizontal axis of FIG. 4 is time tm. The vertical axis is the frequency of the first AC component.

At a first time t1 at the start of the first operation OP1, the first AC component has a first time frequency f1. At a second time t2 after the first time t1 in the first operation OP1, the first AC component has a second time frequency f2. In this example, the second time frequency f2 is higher than the first time frequency f1.

As shown in FIG. 4, at a third time t3 after the second time t2 in the first operation OP1, the first AC component has a third time frequency f3. The third time frequency f3 is lower than the second time frequency f2. The first time frequency f1, the second time frequency f2 and the third time frequency f3 may be angular frequencies.

Thus, in the first operation OP1, the frequency of the first AC component may increase and then decrease. In the embodiment, in the first operation OP1, the frequency of the first AC component may decrease and then increase.

In one example, the first time frequency f1 may correspond to the sum of the first characteristic frequency $\omega 1$ of the first qubit 11Q and the second characteristic frequency $\omega 2$ of the second qubit 12Q.

For example, the first difference (absolute value) between the first time frequency f1 and the sum of the first characteristic frequency $\omega 1$ of the first qubit 11Q and the second characteristic frequency $\omega 2$ of the second qubit 12Q is smaller than the second difference (absolute value) between the sum and the second time frequency f2.

The first characteristic frequency $\omega 1$ corresponds, for example, to the first resonance frequency of the first qubit 11Q when no signal from the outside is applied to the first qubit 11Q. The second characteristic frequency $\omega 2$ corresponds to the second resonance frequency of the second qubit 12Q when no signal from the outside is applied to the second qubit 12Q.

When the first characteristic frequency $\omega 1$ is higher than the second characteristic frequency $\omega 2$, the resonance frequency of the first qubit 11Q is shifted from the initial value to the high frequency side by the AC stark shift caused by the first signal wave AS1. When the first characteristic frequency $\omega 1$ is lower than the second characteristic frequency $\omega 2$, the resonance frequency of the first qubit 11Q is shifted from the initial value to the low frequency side by the AC stark shift caused by the first signal wave AS1. In a first condition in which the first characteristic frequency $\omega 1$ is higher than the second characteristic frequency $\omega 2$, the second time frequency f2 is set higher than the first time frequency f1. In a second condition in which the first characteristic frequency $\omega 1$ is lower than the second characteristic frequency $\omega 2$, the second time frequency f2 is set lower than the first time frequency f1.

In the first condition described above, the third time frequency f3 is lower than the second time frequency f2. In the second condition described above, the third time frequency f3 is higher than the second time frequency f2.

In the computing device 120, the same operation as the first operation OP1 described above may be applied to the second qubit 12Q. The controller 70 may cause the second control member 72 to execute the second operation. In the second operation, the controller 70 causes the second control member 72 to apply a second qubit signal wave including a second qubit AC component to the second loop 12L. The frequency of the second qubit AC component changes with time. High speed two-qubit gate can be executed on the first qubit 11Q and the second qubit 12Q. High gate fidelity two-qubit gates can be executed.

In the first operation OP1, the first parametric excitation frequency fp1 may be modulated.

Figure 5:
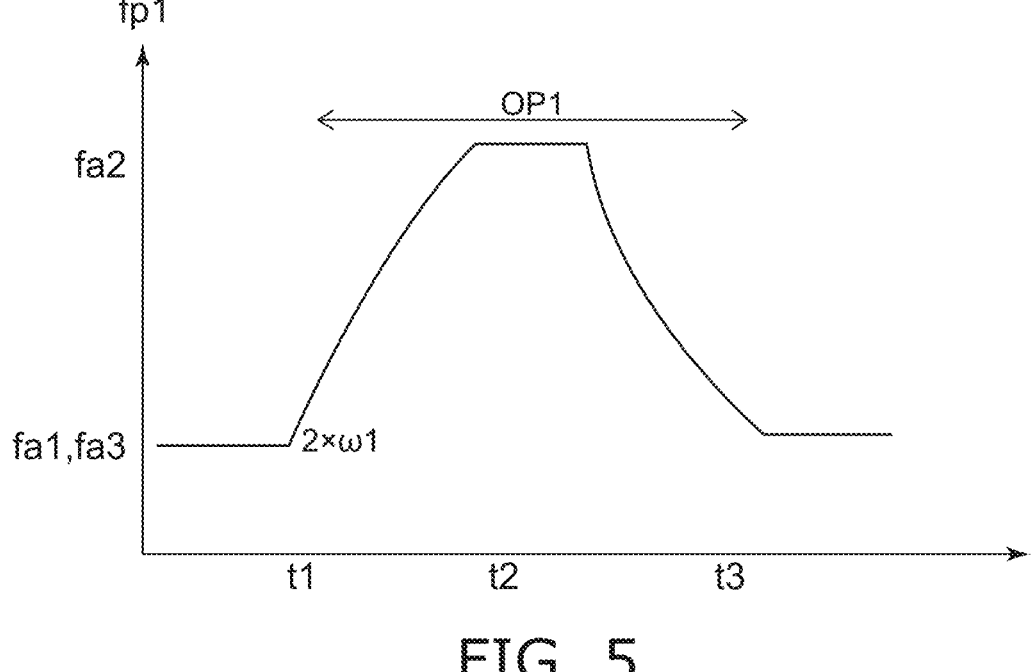
FIG. 5 is a schematic diagram illustrating the operation of the computing device according to the embodiment.

FIG. 5 is a schematic diagram illustrating the operation of the computing device according to the embodiment.

As shown in FIG. 5, in the state before the first operation OP1, the first parametric excitation frequency fp1 is a frequency fa1. The frequency fa1 is substantially twice the first characteristic frequency $\omega 1$ of the first qubit 11Q. By the first operation OP1, the first parametric excitation frequency fp1 is changed to a frequency fa2. After the first operation OP1, the first parametric excitation frequency fp1 is set to a frequency fa3. The frequency fa3 is substantially twice the first characteristic frequency $\omega 1$.

The embodiments may include the following Technical proposals:

Technical Proposal 1

A computing device, comprising:
an element section, including
    a first qubit including a first loop including a plurality of first Josephson junctions, and
    a second qubit including a second loop including a plurality of second Josephson junctions, the second qubit being configured to be connected with the first qubit;
a first control member; and
a controller configured to cause the first control member to execute a first operation,
in the first operation, the controller being configured to cause the first control member to apply a pulse wave including a DC component to the first loop while applying a first signal wave including a first AC component to the first loop.

Technical Proposal 2

The computing device according to Technical proposal 1, wherein
a magnetic flux in the first loop is modulated with the frequency of the first AC component by the first signal wave, and
the magnetic flux in the first loop is controlled according to the DC component by the pulse wave.

Technical Proposal 3

The computing device according to Technical proposal 1, wherein
a frequency of the first AC component is a sum of a first characteristic frequency of the first qubit and a second characteristic frequency of the second qubit.

Technical Proposal 4

The computing device according to Technical proposal 3, wherein the first characteristic frequency corresponds to a first resonance frequency of the first qubit when no external signal is applied to the first qubit, and a second characteristic frequency corresponds to a second resonance frequency of the second qubit when no external signal is applied to the second qubit.

Technical Proposal 5

The computing device according to any one of Technical proposals 1-4, wherein the controller executes a two-qubit gate on the first qubit and the second qubit by the first operation.

Technical Proposal 6

The computing device according to Technical proposal 1, wherein in the first operation, the controller causes the first control member to apply the pulse wave including the DC component to the first loop while applying the first signal wave including the first AC component to the first loop while applying the second signal wave including the second AC component to the first loop.

Technical Proposal 7

The computing device according to Technical proposal 6, wherein a difference between a second phase of the second AC component and a first phase of the first AC component is not less than 80 degrees and not more than 110 degrees.

Technical Proposal 8

The computing device according to any one of Technical proposal 1-7, wherein the first qubit and the second qubit are parametric oscillators.

Technical Proposal 9

A computing device, comprising an element section including a first qubit including a first loop including a plurality of first Josephson junctions, and a second qubit including a second loop including a plurality of second Josephson junctions, the second qubit being configured to be connected with the first qubit; and a first control member; and a controller configured to cause the first control member to execute a first operation, in the first operation, the controller being configured to cause the first control member to apply a first signal wave including a first AC component to the first loop, and a frequency of the first AC component being configured to change with time.

Technical Proposal 10

The computing device according to Technical proposal 9, wherein at a first time at a beginning of the first operation, the first AC component has a first time frequency, at a second time after the first time in the first operation, the first AC component has a second time frequency, in a first condition where a first characteristic frequency of the first qubit is higher than a second characteristic frequency of the second qubit, the second time frequency is higher than the first time frequency, and in a second condition where the first characteristic frequency is lower than the second characteristic frequency, the second time frequency is lower than the first time frequency.

Technical Proposal 11

The computing device according to Technical proposal 10, wherein at a third time after the second time in the first operation, the first AC component has a third time frequency, in the first condition, the third time frequency is lower than the second time frequency, and in the second condition, the third time frequency is higher than the second time frequency.

Technical Proposal 12

The computing device according to Technical proposal 10 or 11, wherein the first time frequency corresponds to a sum of a first characteristic frequency of the first qubit and a second characteristic frequency of the second qubit.

Technical Proposal 13

The computing device according to Technical proposal 10 or 11, wherein a first difference between the first time frequency and a sum of a first characteristic frequency of the first qubit and a second characteristic frequency of the second qubit is smaller than a second difference between the sum and the second time frequency.

Technical Proposal 14

The computing device according to Technical proposal 13, wherein the first characteristic frequency corresponds to a first resonance frequency of the first qubit when no external signal is applied to the first qubit, and the second characteristic frequency corresponds to a second resonance frequency of the second qubit when no external signal is applied to the second qubit.

Technical Proposal 15

The computing device according to any one of Technical proposals 1-14, wherein the first qubit further includes a first capacitor connected in parallel with the first loop.

Technical Proposal 16

The computing device according to any one of Technical proposals 1-15, wherein the first qubit includes a plurality of the first loops, two of the plurality of first loops are connected to each other, and the controller causes the first control member to execute the first operation with respect to each of the plurality of first loops.

Technical Proposal 17

The computing device according to Technical proposal 16, wherein
  the second qubit includes a plurality of the second loops, and
  two of the plurality of second loops are connected to each other.

Technical Proposal 18

The computing device according to Technical proposal 1, further comprising a second control member,
  the controller being configure to cause the second control member to execute a second operation, and
  in the second operation, the controller being configured to causes the second control member to apply a second qubit pulse wave including a second qubit DC component to the second loop while applying a second qubit signal wave including a second qubit AC component to the second loop.

Technical Proposal 19

The computing device according to Technical proposal 9, further comprising a second control member,
  the controller being configured to cause the second control member to execute a second operation,
  in the second operation, the controller being configured to causes the second control member to apply a second qubit signal wave including a second qubit AC component to the second loop, and
  a frequency of the second qubit AC component being configured change with time.

Technical Proposal 20

The computing device according to any one of Technical proposals 1-19, wherein
  the first qubit is configured to oscillate by modulating a magnetic flux in the first loop with a first parametric excitation frequency,
  the second qubit is configured to oscillate by modulating a magnetic flux in the second loop with a second parametric excitation frequency, and
  the controller is configured to change the first parametric excitation frequency in the first operation.

According to the embodiments, an electronic circuit and a computing device capable of improving characteristics can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the computing devices such as element sections, qubits, control members, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all computing devices practicable by an appropriate design modification by one skilled in the art based on the computing devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A computing device, comprising:
  an element section, including
    a first qubit including a first loop including a plurality of first Josephson junctions, and
    a second qubit including a second loop including a plurality of second Josephson junctions, the second qubit being configured to be connected with the first qubit;
  a first control member; and
  a controller configured to cause the first control member to execute a first operation,
  in the first operation, the controller being configured to cause the first control member to apply a pulse wave including a DC component to the first loop while applying a first signal wave including a first AC component to the first loop,
  wherein
    a frequency of the first AC component is a sum of a first characteristic frequency of the first qubit and a second characteristic frequency of the second qubit.
2. The device according to claim 1, wherein
  a magnetic flux in the first loop is modulated with the frequency of the first AC component by the first signal wave, and
  the magnetic flux in the first loop is controlled according to the DC component by the pulse wave.
3. The device according to claim 1, wherein
  the first characteristic frequency corresponds to a first resonance frequency of the first qubit when no external signal is applied to the first qubit, and
  a second characteristic frequency corresponds to a second resonance frequency of the second qubit when no external signal is applied to the second qubit.
4. The device according to claim 1, wherein
  the controller executes a two-qubit gate on the first qubit and the second qubit by the first operation.
5. The device according to claim 1, wherein
  the first qubit and the second qubit are parametric oscillators.
6. The device according to claim 1, wherein
  the first qubit further includes a first capacitor connected in parallel with the first loop.

7. The device according to claim 1, wherein
the first qubit includes a plurality of the first loops,
two of the plurality of first loops are connected to each
other, and
the controller causes the first control member to execute
the first operation with respect to each of the plurality
of first loops.

8. The device according to claim 7, wherein
the second qubit includes a plurality of the second loops,
and
two of the plurality of second loops are connected to each
other.

9. The device according to claim 1, further comprising a
second control member,
the controller being configure to cause the second control
member to execute a second operation, and
in the second operation, the controller being configured to
causes the second control member to apply a second
qubit pulse wave including a second qubit DC compo-
nent to the second loop while applying a second qubit
signal wave including a second qubit AC component to
the second loop.

10. The device according to claim 1, wherein
the first qubit is configured to oscillate by modulating a
magnetic flux in the first loop with a first parametric
excitation frequency,
the second qubit is configured to oscillate by modulating
a magnetic flux in the second loop with a second
parametric excitation frequency, and
the controller is configured to change the first parametric
excitation frequency in the first operation.

11. A computing device, comprising:
an element section, including
a first qubit including a first loop including a plurality
of first Josephson junctions, and
a second qubit including a second loop including a
plurality of second Josephson junctions, the second
qubit being configured to be connected with the first
qubit;
a first control member; and
a controller configured to cause the first control member
to execute a first operation,
in the first operation, the controller being configured to
cause the first control member to apply a pulse wave
including a DC component to the first loop while
applying a first signal wave including a first AC com-
ponent to the first loop,
wherein
in the first operation, the controller causes the first
control member to apply the pulse wave including
the DC component to the first loop while applying
the first signal wave including the first AC compo-
nent to the first loop while applying a second signal
wave including a second AC component to the first
loop.

12. The device according to claim 11, wherein
a difference between a second phase of the second AC
component and a first phase of the first AC component
is not less than 80 degrees and not more than 110
degrees.

13. A computing device, comprising
an element section including
a first qubit including a first loop including a plurality
of first Josephson junctions, and
a second qubit including a second loop including a
plurality of second Josephson junctions, the second
qubit being configured to be connected with the first
qubit; and
a first control member; and
a controller configured to cause the first control member
to execute a first operation,
in the first operation, the controller being configured to
cause the first control member to apply a first signal
wave including a first AC component to the first loop,
and
a frequency of the first AC component being configured to
change with time,
wherein
at a first time at a beginning of the first operation, the
first AC component has a first time frequency,
at a second time after the first time in the first operation,
the first AC component has a second time frequency,
in a first condition where a first characteristic frequency
of the first qubit is higher than a second characteristic
frequency of the second qubit, the second time
frequency is higher than the first time frequency, and
in a second condition where the first characteristic
frequency is lower than the second characteristic
frequency, the second time frequency is lower than
the first time frequency.

14. The device according to claim 13, wherein
at a third time after the second time in the first operation,
the first AC component has a third time frequency,
in the first condition, the third time frequency is lower
than the second time frequency, and
in the second condition, the third time frequency is higher
than the second time frequency.

15. The device according to claim 13, wherein
the first time frequency corresponds to a sum of a first
characteristic frequency of the first qubit and a second
characteristic frequency of the second qubit.

16. The device according to claim 13, wherein
a first difference between the first time frequency and a
sum of a first characteristic frequency of the first qubit
and a second characteristic frequency of the second
qubit is smaller than a second difference between the
sum and the second time frequency.

17. The device according to claim 16, wherein
the first characteristic frequency corresponds to a first
resonance frequency of the first qubit when no external
signal is applied to the first qubit, and
the second characteristic frequency corresponds to a sec-
ond resonance frequency of the second qubit when no
external signal is applied to the second qubit.

18. The device according to claim 13, further comprising
a second control member,
the controller being configured to cause the second con-
trol member to execute a second operation,
in the second operation, the controller being configured to
causes the second control member to apply a second
qubit signal wave including a second qubit AC com-
ponent to the second loop, and
a frequency of the second qubit AC component being
configured change with time.

* * * * *